(12) United States Patent
Clem

(10) Patent No.: US 9,729,130 B2
(45) Date of Patent: Aug. 8, 2017

(54) BUILDING SAMPLE RATE INDEPENDENT TIMING DIAGRAMS USING DIGITAL EDGE AVERAGING

(71) Applicant: Tektronix, Inc., Beaverton, OR (US)

(72) Inventor: Jonathan D. Clem, Hillsboro, OR (US)

(73) Assignee: Tektronix, Inc., Beaverton, OR (US)

( * ) Notice: Subject to any disclaimer, the term of this patent is extended or adjusted under 35 U.S.C. 154(b) by 1244 days.

(21) Appl. No.: 13/628,971

(22) Filed: Sep. 27, 2012

(65) Prior Publication Data

US 2014/0088901 A1    Mar. 27, 2014

(51) Int. Cl.
*H03K 5/1532*    (2006.01)
*H04L 1/20*    (2006.01)
*G01R 13/02*    (2006.01)

(52) U.S. Cl.
CPC ......... *H03K 5/1532* (2013.01); *H04L 1/205* (2013.01); *G01R 13/02* (2013.01)

(58) Field of Classification Search
CPC .. H03K 5/1532; H03K 5/1534; H03K 5/1536; H04L 1/205; G01R 13/02; G01R 13/345; G01R 13/34; G01R 13/22; G01R 31/28; G01R 31/3177; G06F 11/25
See application file for complete search history.

(56) References Cited

U.S. PATENT DOCUMENTS 4,777,616 A * 10/1988 Moore ............... G01R 31/3177
                                              703/15
5,999,163 A    12/1999 Ivers et al.
2005/0246113 A1    11/2005 Montijo

FOREIGN PATENT DOCUMENTS

WO    2006/020759 A2    2/2006

OTHER PUBLICATIONS

Extended European Search Report for European Patent Application No. 13186478.7 dated Oct. 9, 2014, 13 pages, Munich.

* cited by examiner

*Primary Examiner* — Manuel L Barbee
(74) *Attorney, Agent, or Firm* — Marger Johnson; Thomas F. Lenihan

(57) ABSTRACT

A method can include receiving an input signal having multiple signal edges, performing an initial scan of the input signal to identify peaks corresponding to the signal edges, and determining whether each peak is a Uniformly Synchronous (US) edge or a Quasi-Synchronous (QS) edge. The method can also include generating a final waveform and displaying the final waveform on a display device.

11 Claims, 4 Drawing Sheets

BUILDING SAMPLE RATE INDEPENDENT TIMING DIAGRAMS USING DIGITAL EDGE AVERAGING

BACKGROUND

Digital acquisition devices, such as the Tektronix TLA7000 Logic Analyzer, enable electrical engineers to measure the signals produced by the digital systems that they design. Research labs use digital acquisition devices to observe correctness of timing and intensity of signals in microprocessors, memory, buses, and other components of digital systems. Acquisition devices play a major role in the development of the continually advancing electronics industry.

A digital acquisition device will typically display a sensed signal as a sharply elevated or descending step. The rise from "off" to "on" and the descent from "on" to "off" is usually synchronized with the period of a clock in the system under test, and the transition from one state to the other is represented visually as a vertical edge. It is useful to distinguish the clock of a system under test from a clock of a digital acquisition device.

In order to provide high resolution on the signal under test, the sample clock of the digital acquisition device must pulse, and therefore sample the signal under test, at a frequency higher than the frequency of the tested system's clock. This yields meaningful measurements to engineers using the acquisition device. The distance between two consecutive pulses of the clock for the digital acquisition device may be referred to as a sampling bin, and the pulse itself is the sampling bin boundary. A rising or falling edge in an ideal scenario will consistently land within a single sample bin and, therefore. will be consistently associated with a single sample clock edge.

When testing a particular design, engineers sometimes measure a signal occurring in a repeated pattern. The acquisition device may be programmed to begin data acquisition with a trigger, which can itself be a rising or a falling edge. By supplying a repeating input, engineers can observe whether an input predictably and reliably generates a consistent output. Under ideal circumstances, the output is displayed as a static series of steps if the device is working as expected. Circumstances, however, are not always ideal.

Use of Digital Edge Averaging (DEA) on a set of digital signals can eliminate jitter-related chatter while simultaneously increasing the timing accuracy of the edges beyond the abilities of the base acquisition system. However, DEA alone requires that all edges on all digital signals be Uniformly Synchronous (US) to the trigger event. That is, a DEA representation of any single transition can only be calculated if that edge occurs within a DEA aperture in every repeated acquisition.

Accordingly, there remains a need for improved methods for presenting a waveform on a digital acquisition device.

SUMMARY

Embodiments of the disclosed technology generally include application of Digital Edge Averaging (DEA) techniques to reliably acquire complex digital signal edge relationships to create a digital display that is independent of the base sample rate. Such embodiments generally gain timing accuracy of edge placement beyond that of the base sampling system, recover signals that would otherwise be obscured by jitter effects, and recover edges that would otherwise be obscured by complex relationships to the trigger event.

DETAILED DESCRIPTION

In current systems, a Digital Edge Averaging (DEA) representation of any single transition can only be calculated if that edge occurs within a DEA aperture in every repeated acquisition. There are many opportunities for signals under test to be synchronous by the conventional description but not be Uniformly Synchronous (US). This requires the concept of a Quasi-Synchronous (QS) edge type, which is described below.

As used herein, a QS edge generally refers to an edge that occurs within a DEA aperture but does not occur in every repeated acquisition. Data buses, strobes whose width can be a varying number of clocks, and edges that occur a varying number of clocks from the trigger event are all examples of edge events that are conventionally synchronous to the trigger event (e.g., they may all be based on the same system clock) but are only QS in a DEA sense.

Digital Edge Mapping (DEM) generally utilizes repeated and targeted DEA operations to resolve the QS edges and create a timing diagram that displays all US and QS edges with timing accuracy of edge placement beyond that of the base sampling system. The underlying DEA operations also recover signals that would otherwise be obscured by jitter effects.

Figure 1:
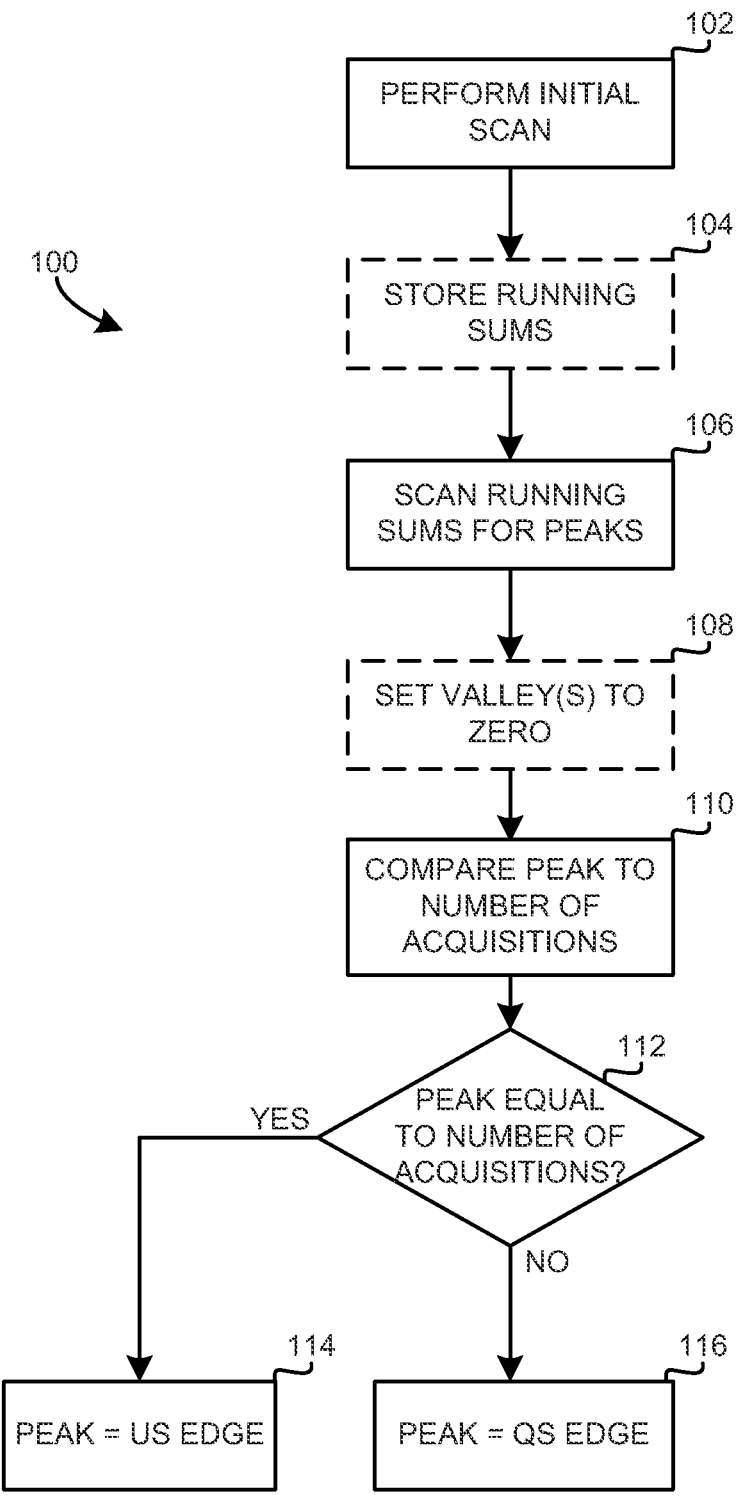
FIG. 1 illustrates an example of a first Digital Edge Mapping (DEM) process in accordance with certain embodiments of the disclosed technology.

FIG. 1 illustrates an example of a Digital Edge Mapping (DEM) process 100 in accordance with certain embodiments of the disclosed technology. The example process 100 begins with a single DEA operation as an initial "scan" for edges, as indicated by 102. The Running Sums from this initial scan, which will be referred to herein as RS-R and RS-F, may be retained for use in determining which edges may require elaboration, as indicated by 104.

Each RS may be scanned for peaks, as indicated by 106. While valleys in the RS distributions will generally be 0, as indicated by 108, peaks may or may not equal the number of acquisitions used in the DEA operation.

Each peak in the RS distribution generally represents an edge. Peaks that are equal to the number of acquisitions performed in the DEA operation generally indicate US edges and peaks that are less than the number of acquisitions performed in the DEA operation generally indicate QS edges. Accordingly, each peak is compared to the number of acquisitions, as indicated at 110, and a determination is made at 112 that is based on the results of the comparing performed at 110.

Responsive to a determination at 112 that the peak is equal to the number of acquisitions performed in the DEA operation, the peak may be designated a US edge, as indicated by 114. Responsive to a determination at 112 that the peak is not equal to, e.g., less than or more than, the number of acquisitions performed in the DEA operation, the peak may be designated a QS edge, as indicated by 116.

Figure 2:
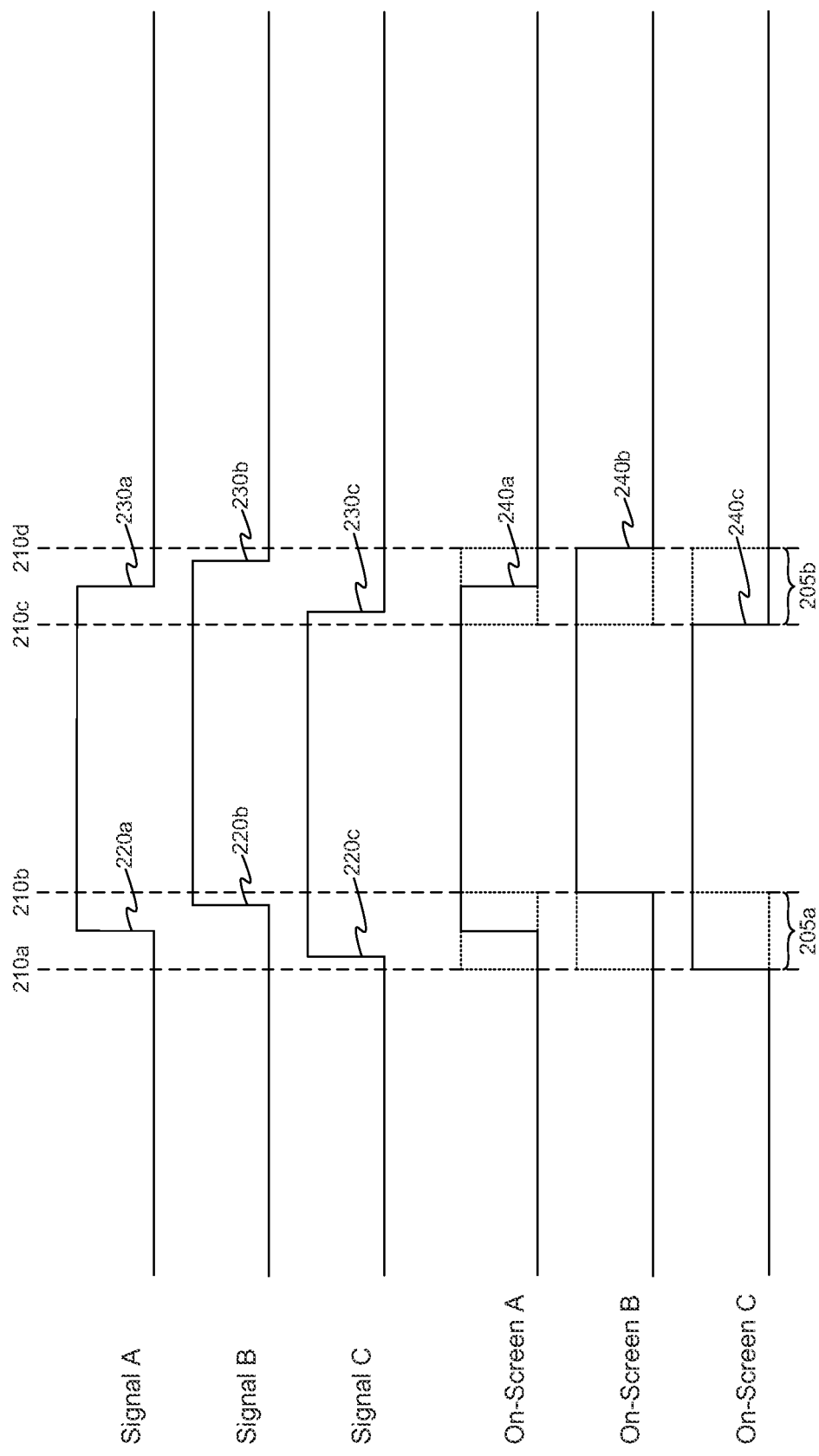
FIG. 2 illustrates an example of a Digital Edge Averaging (DEA) process that may be used to determine US edge locations in accordance with certain embodiments of the disclosed technology.

US edges may be fully elaborated from the initial DBA operation. FIG. 2 illustrates an example of a Digital Edge Averaging (DEA) process that may be used to determine US edge locations in accordance with certain embodiments of the disclosed technology. In the example, a DEA display presents three averaged waveforms 240*a-c* that are superimposed over the corresponding conventionally sampled acquisitions, e.g., having falling/rising edges 220*a-c* and 230*a-c*. The jitter of the conventional waveform, as would be found in sampling bins 205*a* and 205*b*, is depicted by dotted lines.

The DEA operations applied here generally result in a waveform that may be considered super-sampled, e.g., for purposes relating to storage and display. Such a waveform is generally considered as having been sampled at a rate equal to the base sample rate times the number of acquisitions used.

Figure 3:
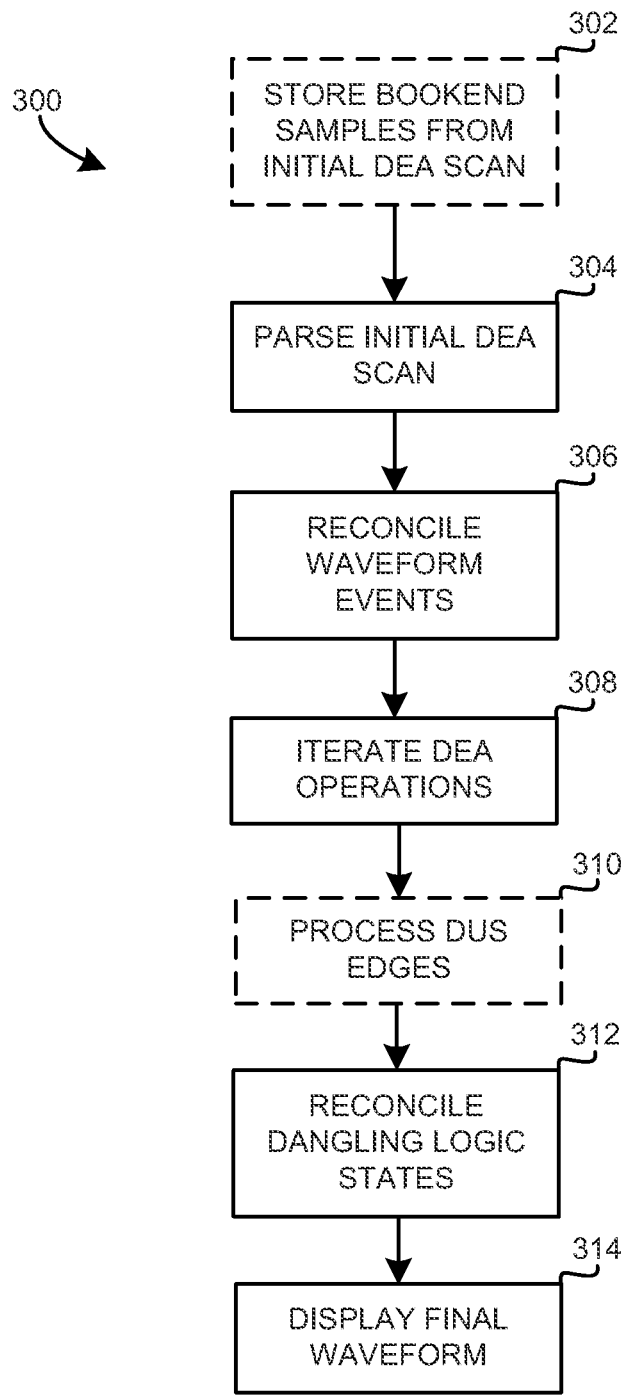
FIG. 3 illustrates an example of a second DEM process in accordance with certain embodiments of the disclosed technology.
Figure 4:
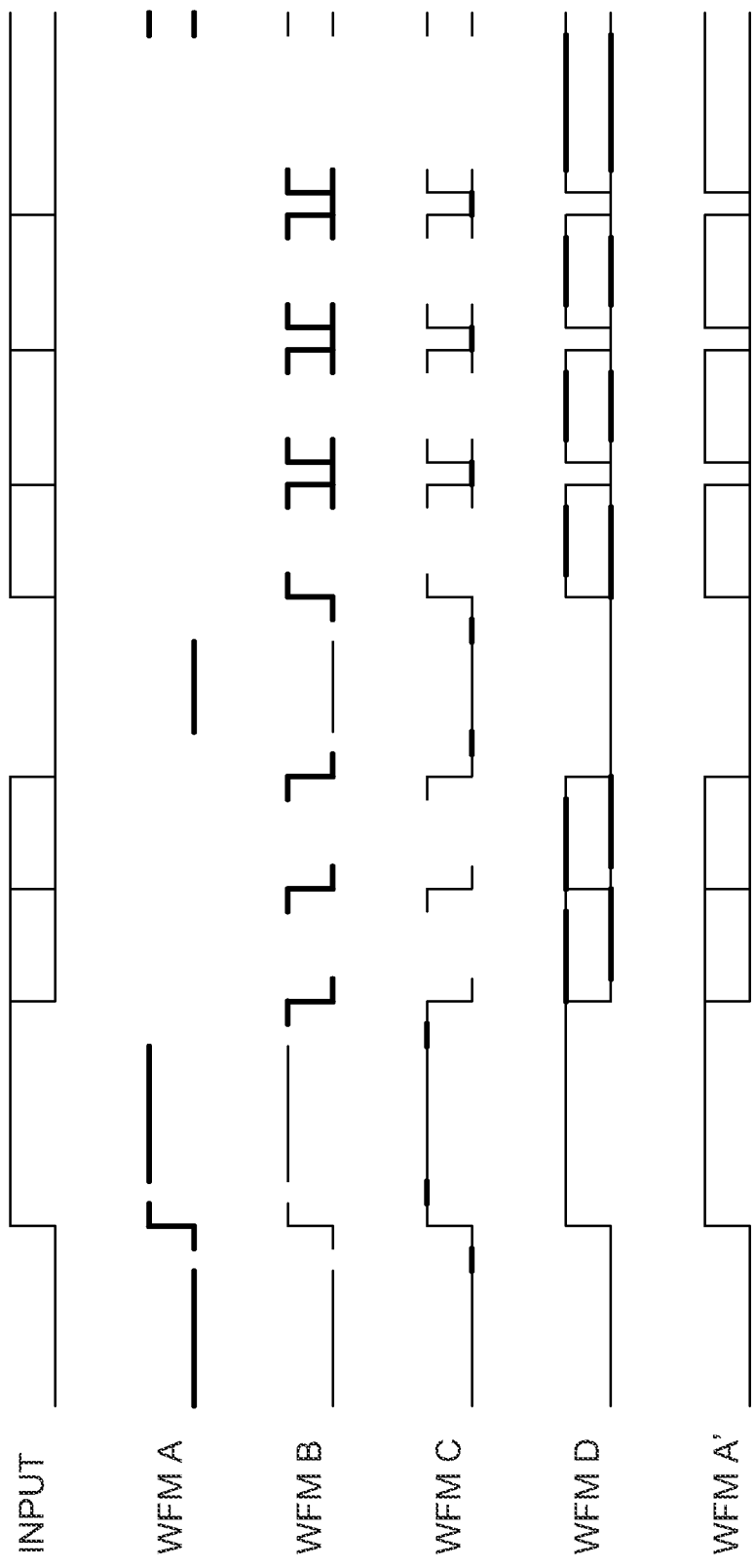
FIG. 4 illustrates an example of waveforms corresponding to an application of the DEM process of FIG. 3 in accordance with certain embodiments of the disclosed technology.

FIG. 3 illustrates an example of a second DEM process 300 in accordance with certain embodiments of the disclosed technology and FIG. 4 illustrates an example of waveforms corresponding to application of such a DEM process. In the example, US edge locations may be written in a final waveform with one dangling logic state on each side, e.g., one for incoming and another for outgoing. These may be assigned 0/1 for rising and 1/0 for falling and are presented in the waveform labeled WFM A in the example illustrated by FIG. 4.

The DEM process 300 may include storing the initial and final "bookend" samples from the initial DEA scan as 1, 0, or x, as indicated by 302. These samples may be considered dangling logic states. In situations where all of the first samples from the initial scan are 1, the starting bookend may be stored as 1. Also, samples that are 0 may be stored as 0 and mixed samples may be stored as x. Such designations may facilitate final reconciliation of dangling logic states. Such dangling logic states may then be written into the final waveform, e.g., as presented in the waveform labeled WFM A in the example illustrated by FIG. 4.

In the example, the DEM process 300 includes creating a static value distribution by parsing the initial DEA scan, as indicated by 304. This may be written directly into the final waveform. An example of such static values is illustrated by the waveform labeled WFM A in FIG. 4. For each DEA sample location, if every acquisition in the initial scan contains a 1, all of the corresponding super-sample locations in the final waveform may be set to 1. Conversely, if every acquisition in the initial scan contains a 0, all of the corresponding super-sample locations in the final waveform may be set to 0.

In situations where a sample location changes in the initial DEA acquisition set, nothing may be written into the corresponding super-sample locations. Results of such operations are presented in the waveform labeled WFM A in the example illustrated by FIG. 4. Super-sample locations may be extrapolated during a reconciliation process, such as that described below.

Until final reconciliation of dangling logic states, the final waveform WFM A' will generally be a scattering of edges, static values, and bookend values. US edges will generally dictate only one dangling logic state on each side, e.g., incoming and outgoing, and rising/falling identification and dangling logic states will generally be preserved for QS edges.

Once all edges are elaborated, a software application may reconcile all of these waveform events, as indicated by 306, by connecting dangling logic states, e.g., outgoing to incoming of the same logic level, and extrapolating orphaned dangling logic states to complete waveform, for example.

The DEM process 300 may continue to iterate DEA operations, as indicated by 308. For each iteration, the DEM process may include going through the list of QS edges and checking to see whether each edge count is less than the requested number of acquisitions to average across. The DEM process may then repeat DEA iterations until all QS edge counts are equal to or greater than the requested number of acquisitions to average across. This advantageously allows for full elaboration of each QS edge.

The QS edge locations may then be calculated and represented in the final waveform WFM A' with dangling logic values in a manner similar to that of the US edges as described above. Such QS edge locations are presented as bolded portions of the waveform labeled WFM B in the example illustrated by FIG. 4.

In certain embodiments, QS pulses that are less than the base sample rate need not be considered or evaluated. The inclusion of Sullivan codes effectively insures that both rising and falling edges of such pulses are fully deterministic in a DEA sense and, therefore, are recoverable in a DEM sense.

In certain embodiments, edges may have acquisitions thrown out due to Fit For Use (FFU) flags in the initial DEA scan. Such edges may be considered QS and elaborated in the same way as other QS edges. These edges are typically US edges that fall into the QS category because of FFU flags and are referred to herein as Disqualified Uniformly Synchronous (DUS) edges.

When performing DEM operations, DUS edges may be flagged and handled differently, as indicated by 310, because the timing data lost to FFU-discarded acquisitions generally cannot be recovered and the DEM representation will usually be incorrect, e.g., the two DUS edges may be skewed further apart from each other than they actually are.

The DEM process 300 generally includes a reconciliation of dangling logic states, as indicated by 312. This processing typically proceeds from left to right on each channel. Going super-sample by super-sample, the reconciliation process generally includes an evaluation as to whether any sequence of locations remains unassigned. Each gap found may then be evaluated so as to determine what logic value(s) to fill in. These gaps generally represent either a single boundary between an aperture and a dwell time or envelope multiple aperture/dwell times.

In situations where the width of an identified gap is less than an aperture time, a short reconciliation is usually done. If there is a matched pair of dangling logic high values across the gap, logic high values may be written into the super-sample locations for that gap. If there is a matched pair of dangling logic low values across the gap, logic low values may be written into the super-sample locations for that gap. There are typically no orphaned dangling logic levels for short gaps. Such gap fills are presented as bolded portions of the waveform labeled WFM C in the example illustrated by FIG. 4.

In situations where the width of the gap is more than or equal to an aperture time, a long reconciliation is usually done. In these situations, it is know that there are both logic states occurring in the dwell times in the gap. Consequently, both logic states may be drawn across the gap. If one or both of the ends of the gap only has one dangling logic state, the opposite logic state may be drawn in all the way to the corresponding edge. Such gap fills are presented as bolded portions of the waveform labeled WFM D in the example illustrated by FIG. 4.

The resulting waveform WFM A' may be visually presented to a user, e.g., displayed on a screen, as indicated by 314.

One having ordinary skill in the art will recognize that logic-high and logic-low values are generally not mutually exclusive in the final waveform. Indeed, the final waveform, e.g., WFM A' in FIG. 4, will typically have the capability of representing points on the channel where the logic level is either high OR low. This advantageously allows for the final waveform to look much more like a timing diagram than a scope acquisition.

The DEM techniques described herein may further identify rise/fall time differences for QS edges, e.g., as demonstrated by the last few transitions in the final waveform WFM A' in the example illustrated by FIG. 4. Because rising/filling edges are generally segregated throughout the entire DEA/DEM processing, the corresponding rise/fall differences may be maintained and can be observed and measured by the user.

Certain implementations of the disclosed technology include an on-screen indicator that indicates how long a particular DEM process is expected to take. For example, a software application may estimate statistically from the initial scan how many DEA iterations will need to take place in order to fully elaborate all edges. The application may also determine how long a single DEA operation typically takes so as to prepare an estimate as to how long the entire DEM process is expected to take.

Having described and illustrated the principles of the invention with reference to illustrated embodiments, it will be recognized that the illustrated embodiments may be modified in arrangement and detail without departing from such principles, and may be combined in any desired manner. And although the foregoing discussion has focused on particular embodiments, other configurations are contemplated.

In particular, even though expressions such as "according to an embodiment of the invention" or the like are used herein, these phrases are meant to generally reference embodiment possibilities, and are not intended to limit the invention to particular embodiment configurations. As used herein, these terms may reference the same or different embodiments that are combinable into other embodiments.

Consequently, in view of the wide variety of permutations to the embodiments described herein, this detailed description and accompanying material is intended to be illustrative only, and should not be taken as limiting the scope of the invention. What is claimed as the invention, therefore, is all such modifications as may come within the scope and spirit of the following claims and equivalents thereto.

The invention claimed is:

1. A system, comprising:
   a digital device configured to produce an input signal having multiple signal edges; and
   a digital acquisition device, the digital acquisition device including:
      an input configured to receive the input signal;
      a sampling clock configured to provide pulses;
      a processor configured to:
         perform an initial scan of the input signal to identify each of a plurality of peaks corresponding to the multiple signal edges in the input signal;
         determine whether each of the plurality of signal peaks is a Uniformly Synchronous (US) edge or a Quasi-Synchronous (QS) edge by comparing an occurrence of a first one of the plurality of signal peaks within two pulses of the sampling clock to a corresponding number of acquisitions of the initial scan; and
         generate a final waveform based on the determining; and
      a display device configured to display the final waveform.

2. The system of claim 1, wherein said processor is configured to perform said determining by designating the first one of the plurality of signal peaks as a US edge responsive to the first one of the plurality of signal peaks being equal to said corresponding number of acquisitions.

3. The system of claim 1, wherein said processor is configured to perform said determining by designating the first one of the plurality of signal peaks as a QS edge responsive to the first one of the plurality of signal peaks not being equal to said corresponding number of acquisitions.

4. The system of claim 1, wherein said processor is further configured to identify a plurality of signal valleys in the input signal.

5. The system of claim 4, wherein said processor is further configured to set each of said plurality of signal valleys in the input signal to zero.

6. The system of claim 1, wherein the digital acquisition device is a logic analyzer.

7. The system of claim 1, wherein the digital acquisition device further includes a memory configured to store the final waveform.

8. A system, comprising:
   a digital device configured to produce an input signal having multiple signal edges; and
   a digital acquisition device, the digital acquisition device including:
      an input configured to receive the input signal;
      a sampling clock configured to provide pulses;
      a processor configured to:
         perform an initial scan of the input signal to identify each of a plurality of peaks corresponding to the multiple signal edges in the input signal;
         determine whether each of the plurality of signal peaks is a Uniformly Synchronous (US) edge or a Quasi-Synchronous (QS) edge by comparing an occurrence of a first one of the plurality of signal peaks within two pulses of the sampling clock to a corresponding number of acquisitions of the initial scan; and
         generate a final waveform based on the determining;
      a memory configured to store a plurality of running sums from the initial scan; and
      a display device configured to display the final waveform.

9. The system of claim 8, wherein said processor is further configured to scan each of the plurality of running sums for said plurality of signal peaks.

10. The system of claim 8, wherein the memory is further configured to store said final waveform.

11. The system of claim 8, wherein the digital acquisition device is a logic analyzer.

* * * * *